(12) United States Patent
Houk

(10) Patent No.: US 7,658,001 B1
(45) Date of Patent: Feb. 9, 2010

(54) ELECTRICAL CONNECTOR FOR DISK DRIVE SUSPENSION ASSEMBLY AND METHOD OF NON-CONTACT SOLDER ATTACHMENT OF SAME

(75) Inventor: Galen D. Houk, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 59 days.

(21) Appl. No.: 11/935,768

(22) Filed: Nov. 6, 2007

Related U.S. Application Data

(62) Division of application No. 11/106,123, filed on Apr. 14, 2005, now abandoned.

(51) Int. Cl.
*B23K 31/02* (2006.01)
(52) U.S. Cl. ............... 29/874; 29/854; 439/74; 228/41; 228/246; 228/179.1; 228/256; 174/254; 174/256
(58) Field of Classification Search ............. 29/874, 29/542; 439/74; 228/41; 174/254, 256
See application file for complete search history.

(56) References Cited

U.S. PATENT DOCUMENTS

| 5,530,604 | A | * | 6/1996 | Pattanaik | 360/234.5 |
| 5,828,031 | A | * | 10/1998 | Pattanaik | 219/121.63 |
| 6,543,677 | B2 | * | 4/2003 | Pattanaik et al. | 228/246 |
| 6,811,073 | B2 | * | 11/2004 | Ohashi et al. | 228/256 |
| 6,822,169 | B2 | | 11/2004 | Kataoka | |
| 2003/0222766 | A1 | | 12/2003 | Rollins et al. | |
| 2005/0051521 | A1 | * | 3/2005 | Shindo et al. | 219/121.64 |

* cited by examiner

*Primary Examiner*—Derris H Banks
*Assistant Examiner*—Dan D Le
(74) *Attorney, Agent, or Firm*—Faegre & Benson LLP

(57) ABSTRACT

A method for electrically connecting disk drive suspension assembly elements including positioning a first component having a first terminal with an edge adjacent to a second component having a second terminal and applying solder to form a solder joint over the edge of the first terminal and onto the second terminal. Heat to melt the solder is provided from a source that is physically remote from the components.

8 Claims, 17 Drawing Sheets

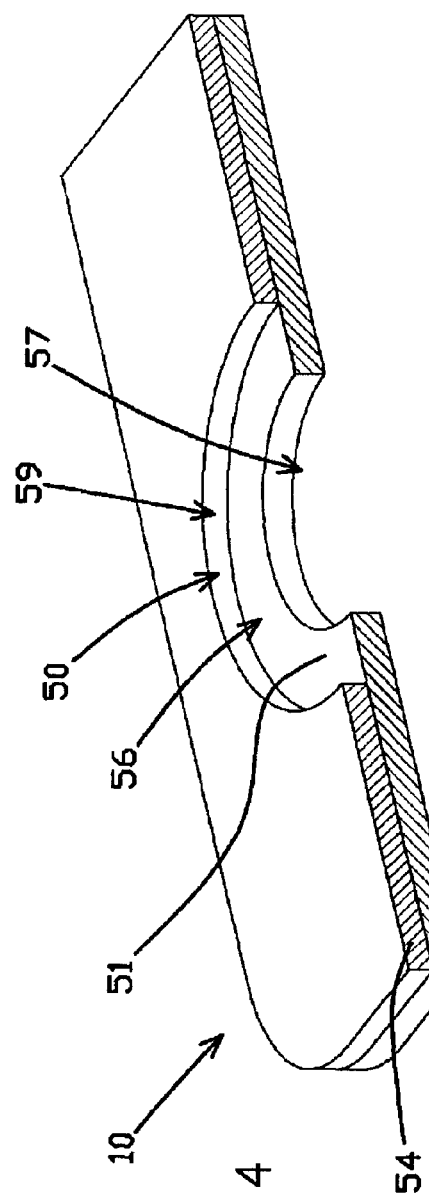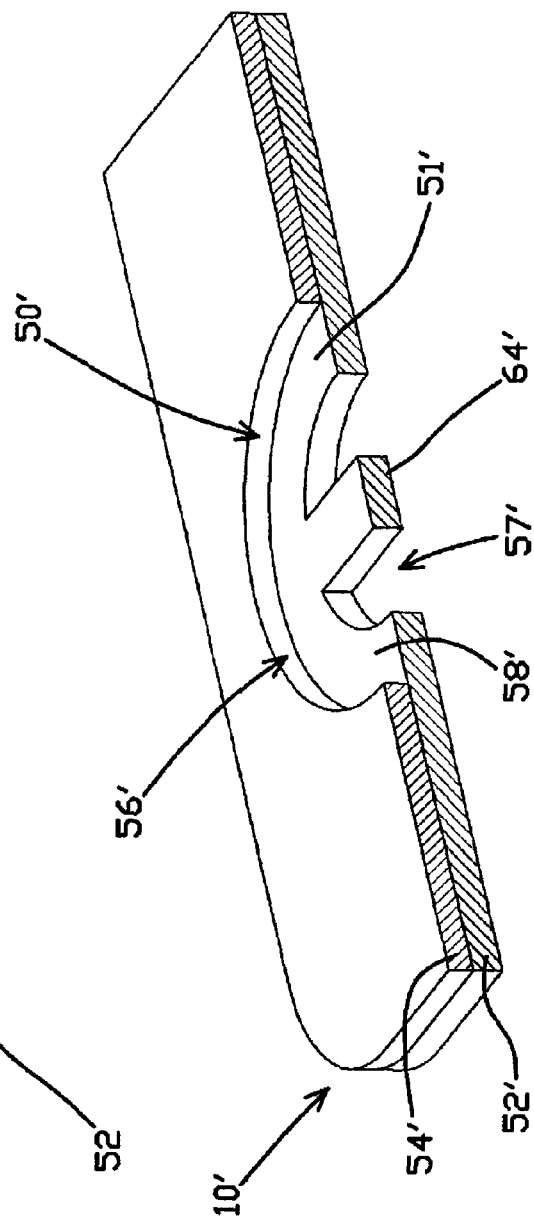
FIG 4
FIG 5

ELECTRICAL CONNECTOR FOR DISK DRIVE SUSPENSION ASSEMBLY AND METHOD OF NON-CONTACT SOLDER ATTACHMENT OF SAME

REFERENCE TO RELATED APPLICATION

This application is a division of U.S. patent application Ser. No. 11/106,123, filed Apr. 14, 2005, and entitled ELECTRICAL CONNECTOR FOR DISK DRIVE SUSPENSION ASSEMBLY AND METHOD OF NON-CONTACT SOLDER ATTACHMENT OF SAME, which is hereby incorporated by reference in its entirety.

FIELD OF THE INVENTION

The present invention relates generally to the field of suspension assemblies for disk drives. More particularly, the invention relates to electrical connections made on the suspension assemblies.

BACKGROUND OF THE INVENTION

Disk drive head suspension assemblies with so-called second stage actuators or microactuators often include piezoelectric motors that are attached to the suspensions to effect movements of the suspension assemblies and components. The piezoelectric motor acts as an actuator and is controlled by electrical and electronic control circuitry that supplies electrical signals to excite the piezoelectric motor and cause the motor to create desired movement of the suspension. The control circuitry is electrically connected to terminals on the piezoelectric motors through flex circuit-type connectors or leads.

Known suspension assemblies have employed wire bonding to connect the flex circuit leads to the terminals of the piezoelectric motors. In the wire bonding process, a terminal on the flex circuit connector is electrically and mechanically attached to a terminal on the piezoelectric motor by ultrasonically welding. However, the ultrasonic welding process has some drawbacks. For example, it can be difficult to effectively achieve a robust electrical connection when wire bonding on the piezoelectric motor. In addition, the vibration created by the ultrasonic welding process can damage the piezoelectric motor, especially the terminal, which typically includes a thin layer of gold, or cause a protective encapsulment material that is applied to the surface of the motor to flake off, potentially compromising the integrity of the motor. Further, the wire bonding process is typically limited to bonding in a linear path. That is, multiple attachments can occur only along a horizontal or vertical line, but not both, without additional process steps.

Another known process includes applying solder to attach the connector to the motor terminal. In this process, a solder bump is applied to the connector and allowed to harden before the connector is positioned adjacent the terminal. The connector is positioned with the solder bump contacting the termination area of the motor so that the solder bump is not directly accessible from an outside surface of the assembly. Then, a holding member is positioned to engage with and apply a spring loaded force against the connector and motor to hold the connector in close proximity to the terminal. The connector is then heated via a heat source applied directly onto the connector. The heat radiates through the connector to the solder until the solder changes to a molten state or "reflows." In the case of a multi-layered connector, heat is applied to an outer layer of the connector. The heat then radiates through the layers of the connector to the solder to reflow it. Once the solder has reflowed, the heat is removed until the solder cools and solidifies to create an electrical and mechanical bond between the terminal and the connector. The holding member continues to apply the spring loaded force after the heat is removed and until the solder has cooled and solidified. The resultant heat, which will also radiate through to the piezoelectric motor, along with the applied spring loaded force, can damage the piezoelectric motor or distort other suspension assembly components. Furthermore, applying solder to the terminal, positioning the connector adjacent the terminal, and heating the assembly to cause the solder to reflow creates added steps in the attachment process.

What is desired is an improved process to attach a connector to the terminal of the piezoelectric motor that can be done efficiently and with relatively little potential for damaging piezoelectric motors. A method that applies minimal force, uses relatively low temperatures or localized heating, and is capable of being performed at very high speed would be especially desirable.

SUMMARY OF THE INVENTION

The invention is a method for electrically connecting disk drive suspension assembly elements including positioning one component having a first terminal with an edge adjacent to another component having a second terminal and applying solder to form a solder joint over the edge of the first terminal and onto the second terminal. Heat to melt the solder is provided from a source that is physically remote from the components. In addition, the invention includes one component with a terminal formed through the component to allow solder to be applied through the one component to attach it to the terminal of another component.

BRIEF DESCRIPTION OF THE DRAWINGS

FIG. 4 is a detailed isometric cross-sectional view of the connecting lead and aperture shown in FIG. 3.

FIG. 5 is a detailed isometric cross-sectional view of the connecting lead and an alternative version of the aperture shown in FIG. 4.

DETAILED DESCRIPTION OF THE INVENTION

Figure 1:
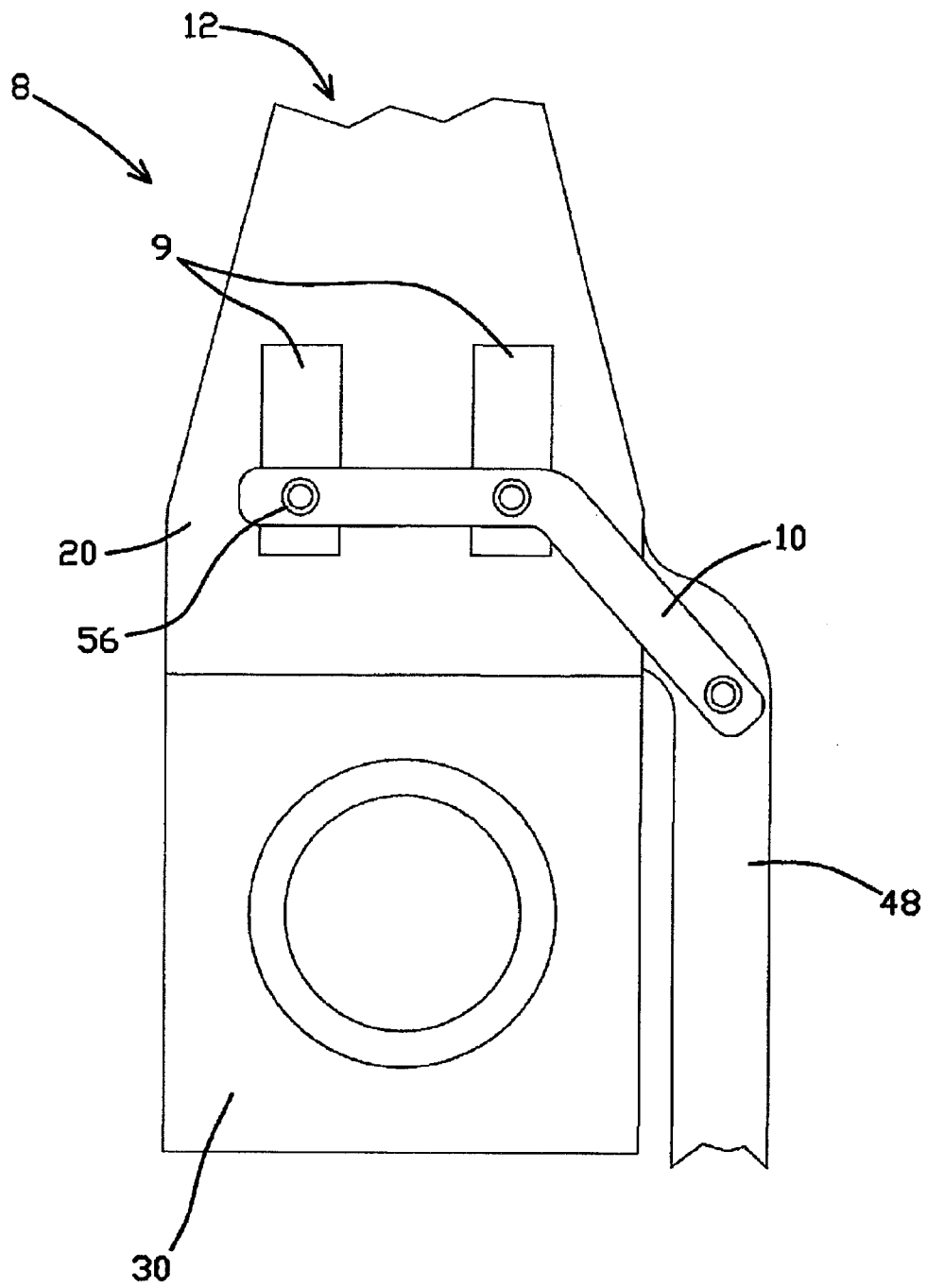
FIG. 1 is a top view of a proximal end of a disk drive suspension assembly having piezoelectric motors and a connecting lead in accordance with one embodiment of the invention.
Figure 2:
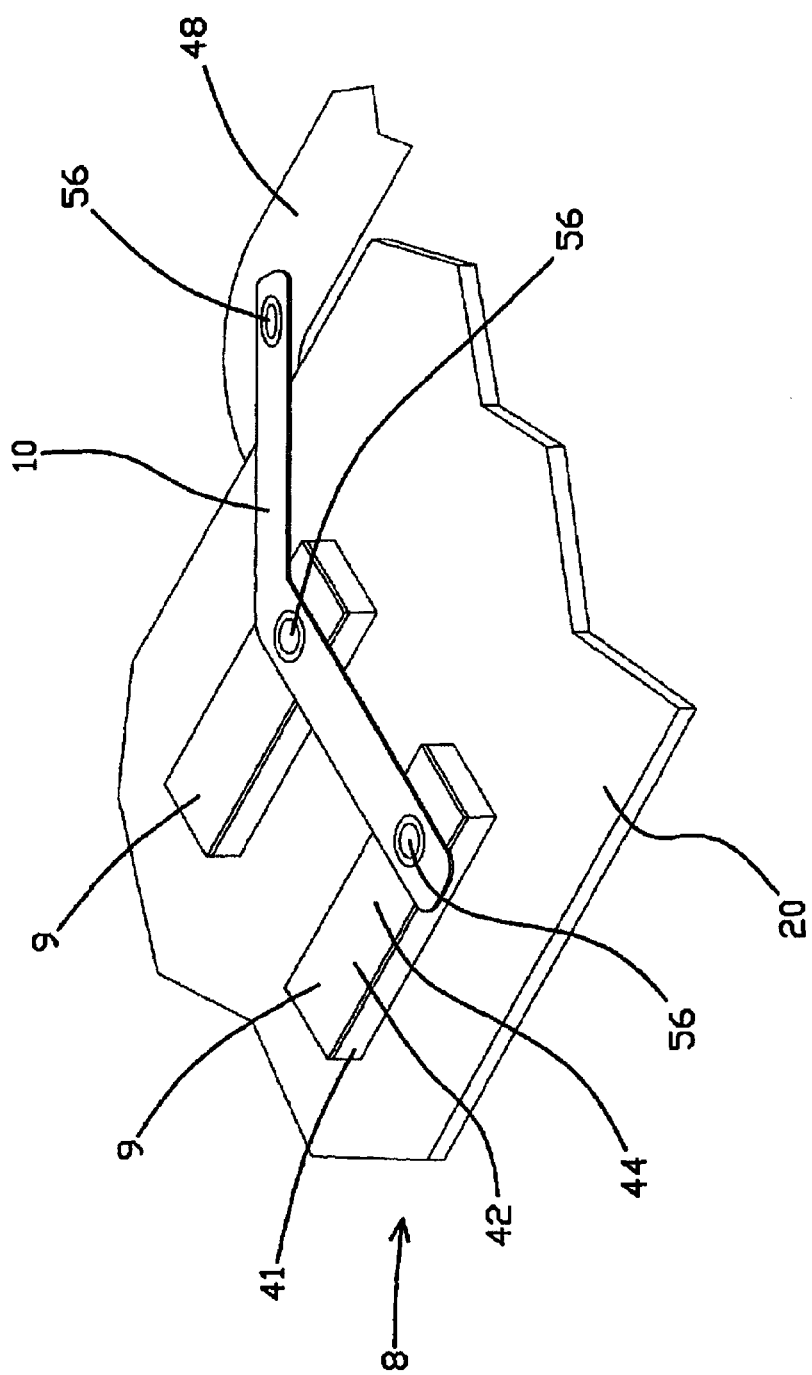
FIG. 2 is an isometric view of a portion of the disk drive suspension assembly shown in FIG. 1 detailing the piezoelectric motors and connecting lead.

FIGS. 1 and 2 illustrate a micro-actuated suspension assembly 8 having a microactuator 9 including a connecting lead 10 in accordance with the present invention. Assembly 8 includes a load beam 20 having a distal end 12 to which a flexure (not shown) is typically mounted and an actuator arm mounting region 30 on a proximal end to allow the assembly to be mounted to an actuator arm (not shown). One or more microactuators 9 are mounted on the load beam 20. The microactuator 9 provides the ability to make relatively fine positioning adjustments of the suspension assembly 8 as may be required during disk drive operation. For example, large scale rotational movements of the suspension assembly 8 may be provided by rotating an actuator arm (not shown), which is attached to the suspension assembly at the actuator arm mounting region 30. For fine control, the microactuators 9 can be actuated to make fine rotational adjustments of the assembly 8. Alternatively, or in addition, microactuators 9 may be used to adjust the height of the head slider assembly (not shown). Microactuator 9 is actuated by applying a control signal to terminals located on the microactuator. While load beam 20 may have structural features to facilitate movement of the suspension assembly, for purposes of clarity, such features are not shown in FIGS. 1 and 2.

Microactuator 9 is, in one embodiment, a piezoelectric motor including a piezoelectric element 41 with a terminal 42 located, for example, on a top surface 44 of the piezoelectric element. Terminal 42 is often formed from gold, but other conductive materials or combinations of materials can be used. Control signals are supplied from an external source (not shown) and are transmitted from the external source along a main lead 48. Connecting lead 10 includes terminals 56, which are attached to main lead 48 and microactuator 9 to provide an electrical and mechanical connection between the main lead and the microactuator. In one embodiment, these connections are made by a solder joint located between one or more of the terminals 56 of connecting lead 10 and either the microactuator 9 or the main lead 48. Alternatively, electrical connections utilizing the connecting lead 10 can be made to any necessary electrical conductor on the head suspension assembly.

Figure 3:
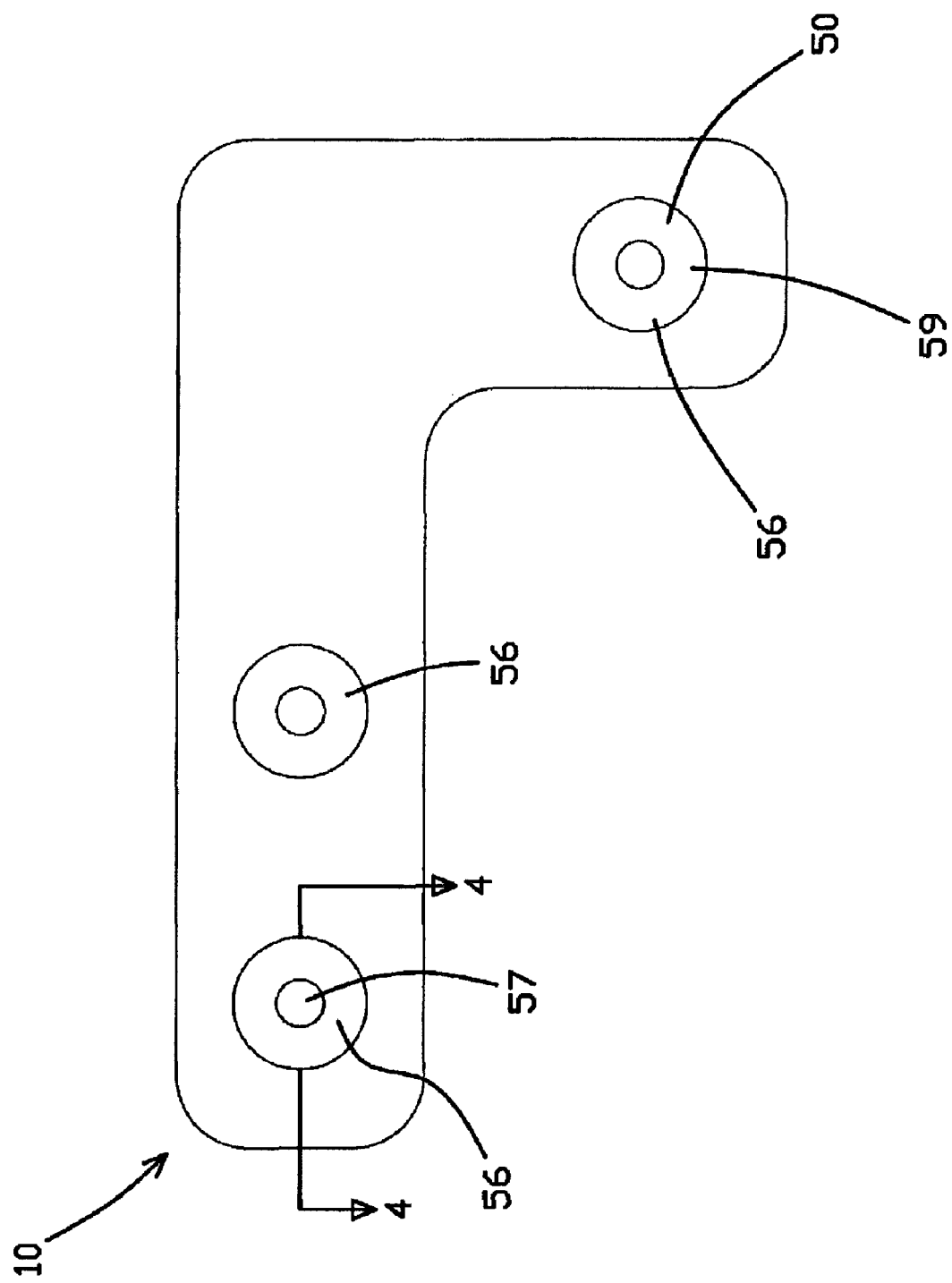
FIG. 3 is a top view of the connecting lead shown in FIG. 1.

Connecting lead 10 can be described in greater detail with reference to FIGS. 3 and 4. Connecting lead 10 is preferably a flexible, multi-layer element that includes a conductive layer 52 formed from copper or other conductor and a dielectric layer 54. Dielectric layer 54 is made from a dielectric material such as a polyimide and is attached to a top surface 58 of the conductive layer 52. The illustrated embodiment of connecting lead 10 includes a plurality of the terminals 56. Each terminal 56 includes an aperture 50 formed into and through each of the layers 52, 54 of the connecting lead 10. The portion of the aperture 50 formed into the conductive layer 52 is smaller than a portion 59 of the aperture formed into the dielectric layer 54, and is shown as reduced aperture portion 57. Because the portion 59 is larger than the reduced aperture portion 57, a portion of the conductive layer 52 is exposed, forming a shoulder 51 within the aperture 50. The shoulder 51 can be simply part of the conductive layer 52. Alternatively, shoulder 51 can also include an additional plated material such as gold, silver, tin or other suitable metals or alloys applied to the surface of the shoulder. It is to be understood that the portion of connecting lead 10 that is cut away in FIG. 4 is, in this embodiment, a mirror image of the portion shown. It is also to be understood that because the interconnection points made between the connecting lead and the microactuator may not be planar with those between the connecting lead and the main lead, connecting lead 10, which can be normally flat, may have a bend or curvature in it (not shown) when it is fully attached to assembly 8.

Alternatively, as shown in FIG. 5, connecting lead 10' includes a terminal 56' having a bridge 64' that extends in a plane from shoulder 51' across the aperture 50' to divide the reduced aperture portion 57' into two separate parts. As with shoulder 51', bridge 64' can simply be a portion of the conductive layer 52' or it can be plated as described above. Again, it is to be understood that the portion of connecting lead 10' in FIG. 5 that is not shown is a mirror image of the portion shown. It also to be understood that while the embodiments shown in FIGS. 3, 4, and 5 have a generally circularly-shaped aperture 50 or 50', the aperture and reduced portion 57 or 57' can take any number of shapes and sizes without departing from the scope of the invention. For example, aperture can have a generally triangular, rectangular, or irregular shape (not shown). Further, the reduced portion of the aperture can have a similar or dissimilar shape from the rest of the aperture. In addition, the bridge 64' shown in FIG. 5 can divide the reduced portion 57' into any number of separate portions, or alternately extend only partially into and not completely across the reduced portion 57' of aperture 50'.

Figure 8:
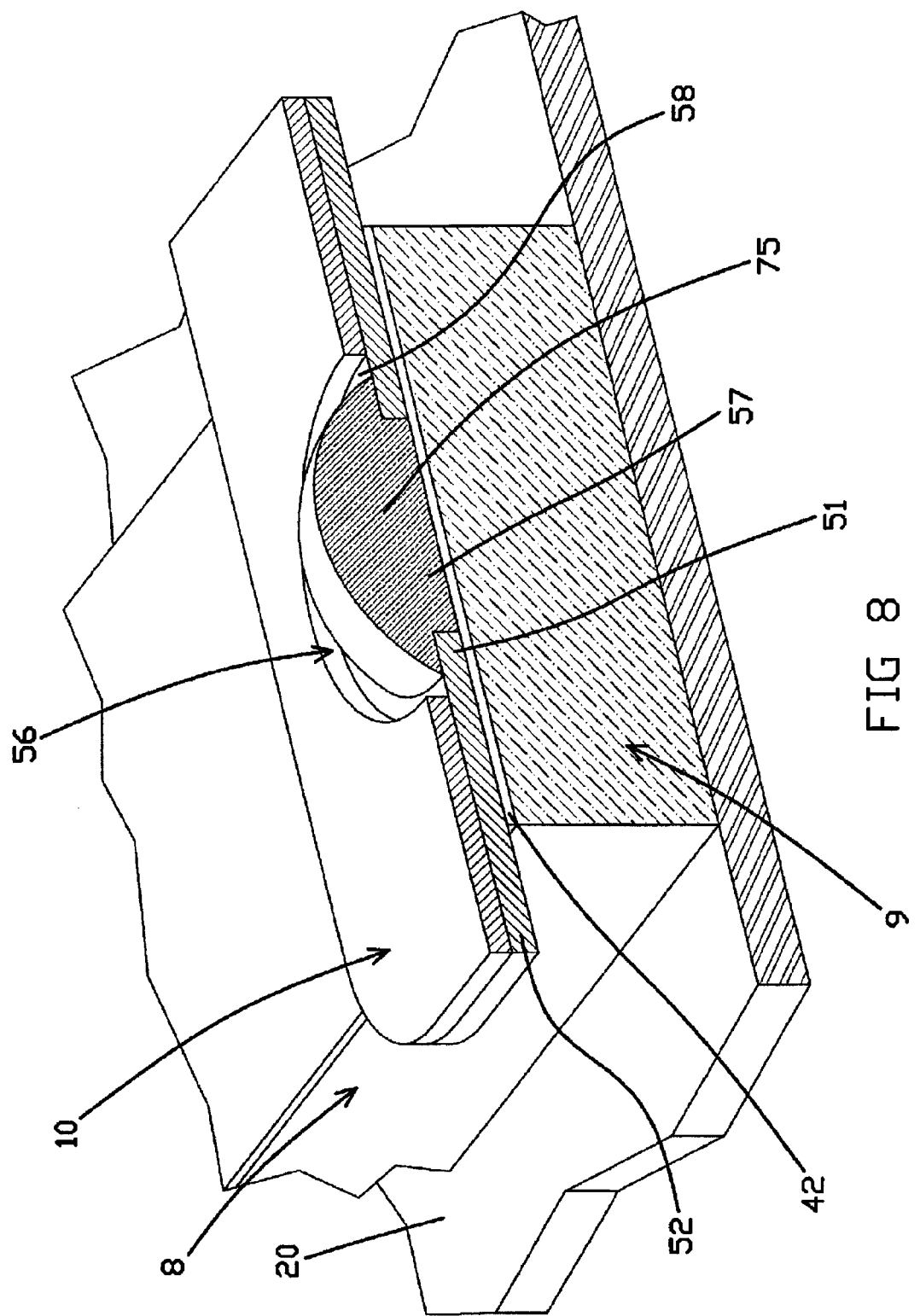
FIG. 8 is an isometric cross-sectional view of the connecting lead and aperture shown in FIG. 4 attached to a piezoelectric motor.

FIG. 8 is a detailed illustration of a portion of the connecting lead 10, shown in FIG. 4, attached to microactuator 9. Connecting lead 10 is positioned so that terminal 56 is adjacent to terminal 42 of microactuator 9. Solder joint 75 is positioned within aperture 56 so that it engages both the top surface 58 of shoulder 51 and the terminal 42 to mechanically and electrically join the connecting lead 10 to the microactuator 9. The solder joint 75, in this embodiment, fills some or all of the reduced portion 57 of aperture 50 and can fill some or all of the remainder of the aperture. While solder may be made of tin or tin and lead, for the purposes of this invention solder can also be formed from other materials or combinations of materials including, without limitation, gold and silver, in addition to lead and tin.

While FIG. 8 details the attachment between the connecting lead 10 and the microactuator 9, it is to be understood that the connecting lead can be attached to the main lead 48 (shown in FIG. 1) as well in a manner similar to or substantially the same as shown in FIG. 8. Further, the attachment structure shown herein can be adapted for any number of different electrical attachment points on a disk drive suspension assembly, including, without limitation, attaching conductors to a flex circuit or a circuit board.

Figure 6:
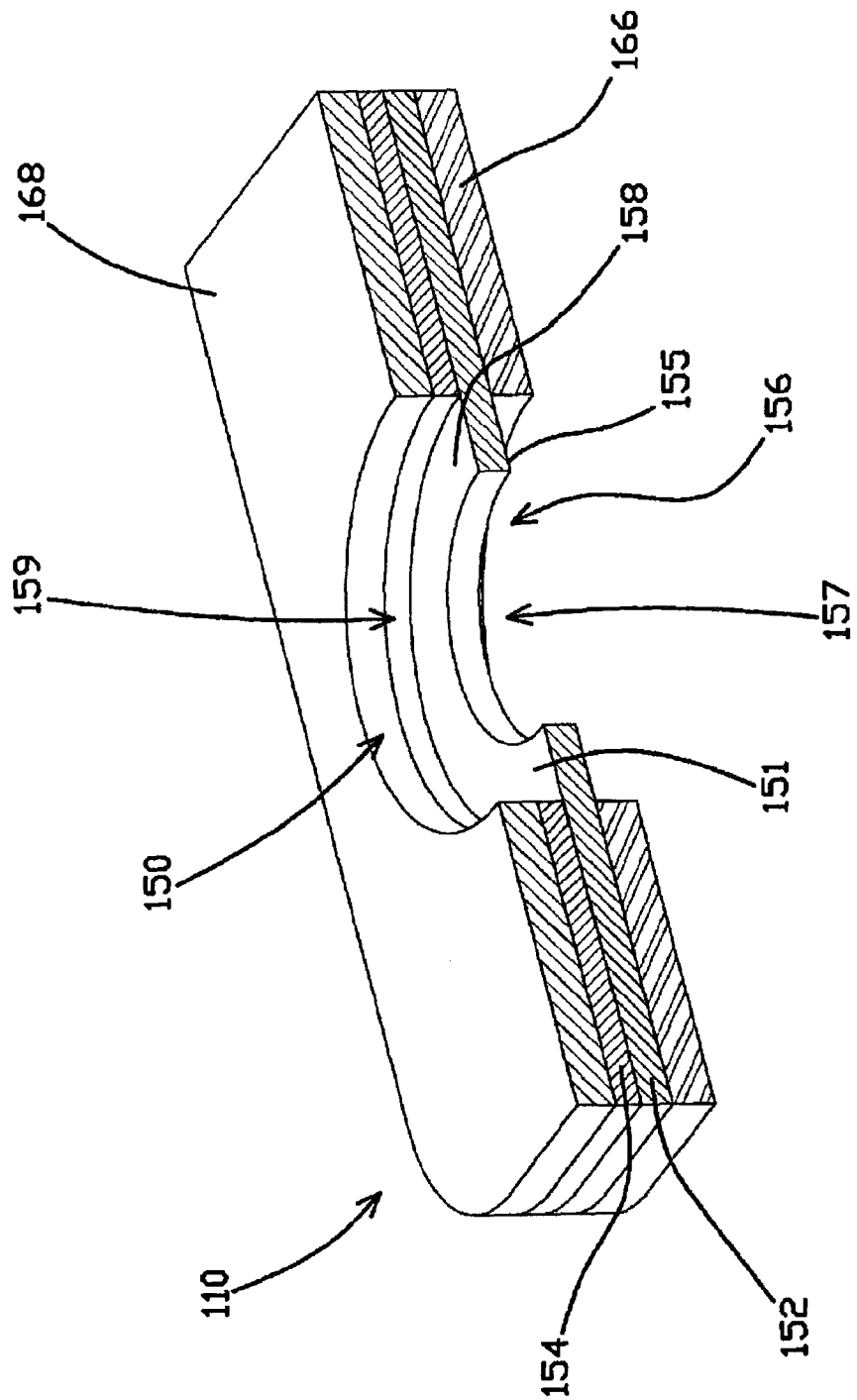
FIG. 6 is an isometric cross-sectional view of the connecting lead and aperture in accordance with another embodiment of the invention.

FIG. 6 details another embodiment of a connecting lead 110 having a terminal 156. Connecting lead 110 includes a cover layer 166 and a backing layer 168. The cover layer 166 can be made of a dielectric material similar to that of a dielectric layer 154, although other materials may be used. Cover layer 166 is attached to a conductive layer 152 along a bottom surface 155 of the conductive layer. Aperture 150 extends through the cover layer 166. The portion of aperture 150 that extends through cover layer 166 is preferably sized and shaped similarly to the portion 159 that extends through the dielectric layer 154. The resulting aperture 150 defines a shoulder 151 with exposed conductive material on both a top surface 158 as well as the bottom surface 155. Alternatively, the portion of the aperture 150 extending through the cover layer 166 can be of any size and shape, including being larger, smaller, or the same size as the reduced aperture portion 157 that extends through the conductive layer 152. It is to be understood that in some of these instances, no portion of the bottom surface 155 of the conductive layer 152 will be exposed in the aperture 150.

The backing layer 168 can be made of a spring metal, such as stainless steel, or other materials. The backing layer 168 is attached to the dielectric layer 154 on an opposing surface from the one that is attached to the conductive layer 152. The backing layer 168 may not be a continuous layer of material or, alternatively, the backing layer may include multiple pieces of material that are not contiguous. Aperture 156 extends through the backing layer 168. The portion of aperture 156 that extends through the backing layer 168 is preferably sized and shaped similarly to the portion that extends through the dielectric layer 154. Alternatively, the portion of the aperture extending through the backing layer 168 can be of any size and shape, although it is preferably larger than the reduced aperture portion 157 extending through the conductive layer 152. While the embodiment shown in FIG. 6 has a connecting lead 110 having both a backing layer 168 and a cover layer 166, the connecting lead may have a backing layer without a cover layer or vice versa without departing from the scope of the invention. Further, the connecting lead 110 can have different shapes, configurations, or extra or different layers of material without departing from the scope of the invention.

In addition, while the embodiment shown has a generally circular aperture 150, the aperture 150 and reduced aperture portion 157 can take any number of shapes and sizes without departing from the scope of the invention. For example, aperture 150 can have a generally triangular, rectangular, or irregular shape (not shown). Further, the reduced aperture portion 157 of the aperture 150 can have a similar or dissimilar shape from the rest of the aperture. With the exception of the addition of the backing layer 168 and the cover layer 166, connecting lead 110 can be substantially the same as connecting lead 10 described above, and similar features are identified by similar reference numbers in the "1xx" series.

Figure 7:
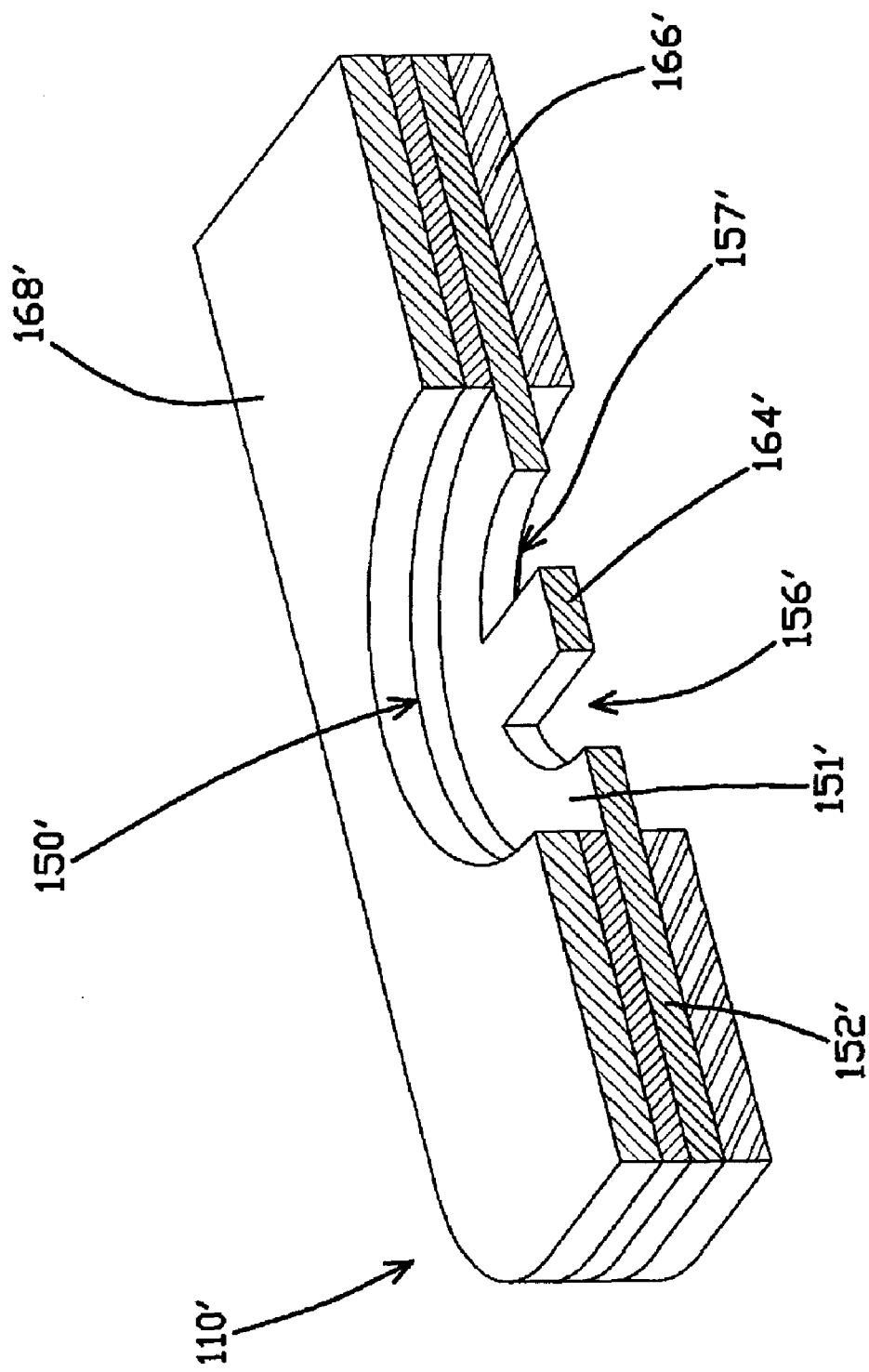
FIG. 7 is a detailed isometric cross-sectional view of an alternative embodiment of the connecting lead and the aperture shown in FIG. 6.

Alternatively, as shown in FIG. 7, connecting lead 110' includes a terminal 156' having a bridge 164'. Bridge 164' extends in a plane from shoulder 151' across the aperture 150' to divide the reduced aperture portion 157' into two separate parts. Both shoulder 151' and bridge 164' can simply be a portion of the conductive layer 152' or the shoulder and bridge can be plated with an additional material such as gold or silver. As shown, cover layer 166' does not extend underneath the bridge 164', although alternatively, cover layer 166' can extend under bridge 164'. It is to be understood that this embodiment can include a backing layer 168' and a cover layer 166', a backing layer without a cover layer, or a cover layer without a backing layer. In addition, and as described above, while the embodiment shown has a generally circular aperture 150', the aperture 150' and reduced aperture portion 157' can take any number of shapes and sizes without departing from the scope of the invention. For example, aperture 150' can have a generally triangular, rectangular, or irregular shape (not shown). Further, the reduced aperture portion 157' of the aperture 150' can have a similar or dissimilar shape from the rest of the aperture.

Figure 9:
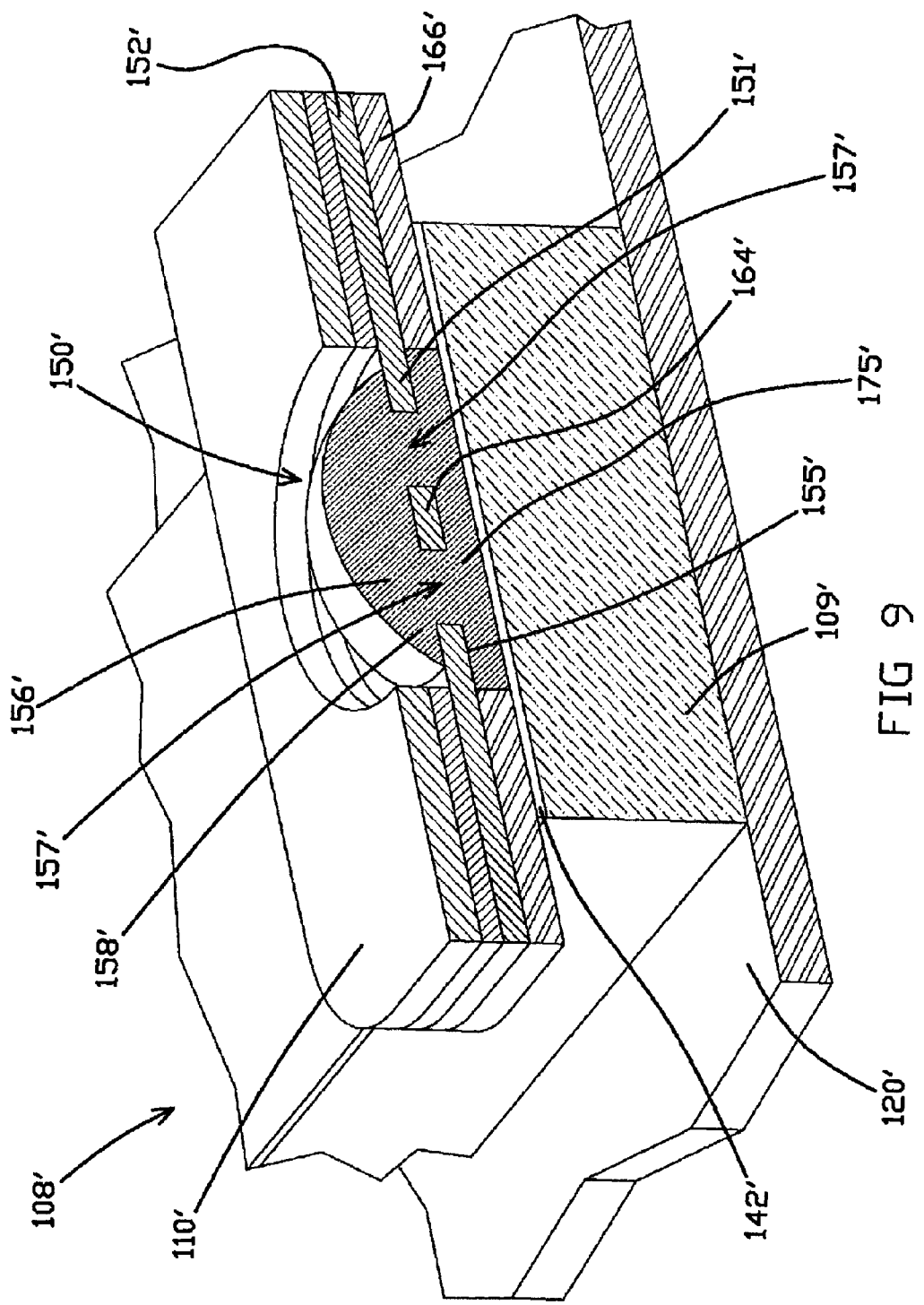
FIG. 9 is an isometric cross-sectional view of the connecting lead and aperture shown in FIG. 7 attached to a piezoelectric motor.

FIG. 9 is a detailed illustration assembly 108' including connecting lead 110', as shown in FIG. 7, attached to a microactuator 109'. Connecting lead 110' is positioned so that terminal 156' is adjacent to microactuator 109'. Solder joint 175' is positioned within aperture 156' so that it engages both the top surface 158' and bottom surface 155' of the shoulder 151' and the terminal 142' to mechanically and electrically join the connecting lead 110' to the microactuator 109'. Further, the solder joint, in this embodiment, fills some or all of the reduced portion 157' on each side of bridge 164' of the aperture 150' and that portion of aperture 150' that is formed into cover layer 166'. The solder joint 175' can fill some or all of the remaining portion of the aperture 150'. With the exception of the differences outlined with respect to connecting lead 110', assembly 108' can be substantially the same as assembly 8 described above, and similar features are identified by similar reference numbers in the "1xx'" series.

While connected leads have been described as having multiple embodiments, it should be understood that any connecting lead may have multiple terminals and that a single connecting lead may incorporate multiple embodiments or alternatives with respect to its terminals without departing from the scope of the invention.

Figure 10A:
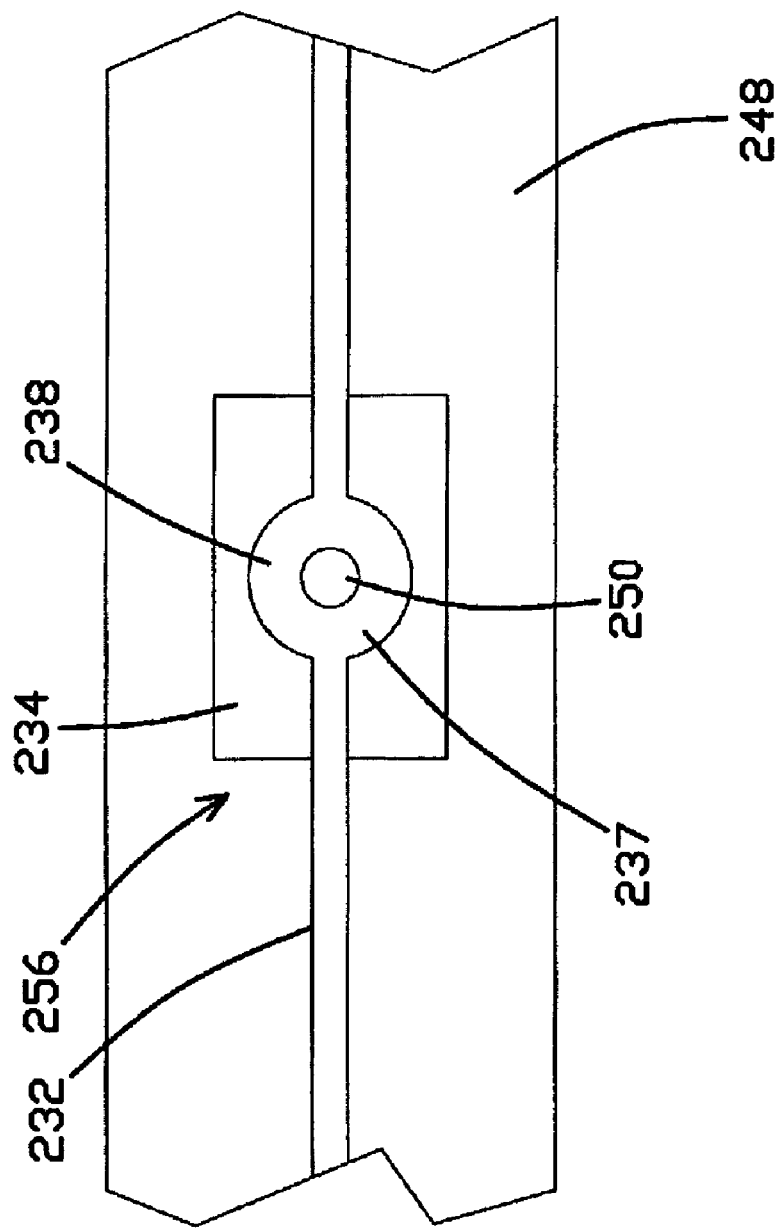
FIG. 10A is a top view of another embodiment of the invention showing a first conductor having a widened portion with an aperture through it and positioned adjacent a second conductor.
Figure 10B:
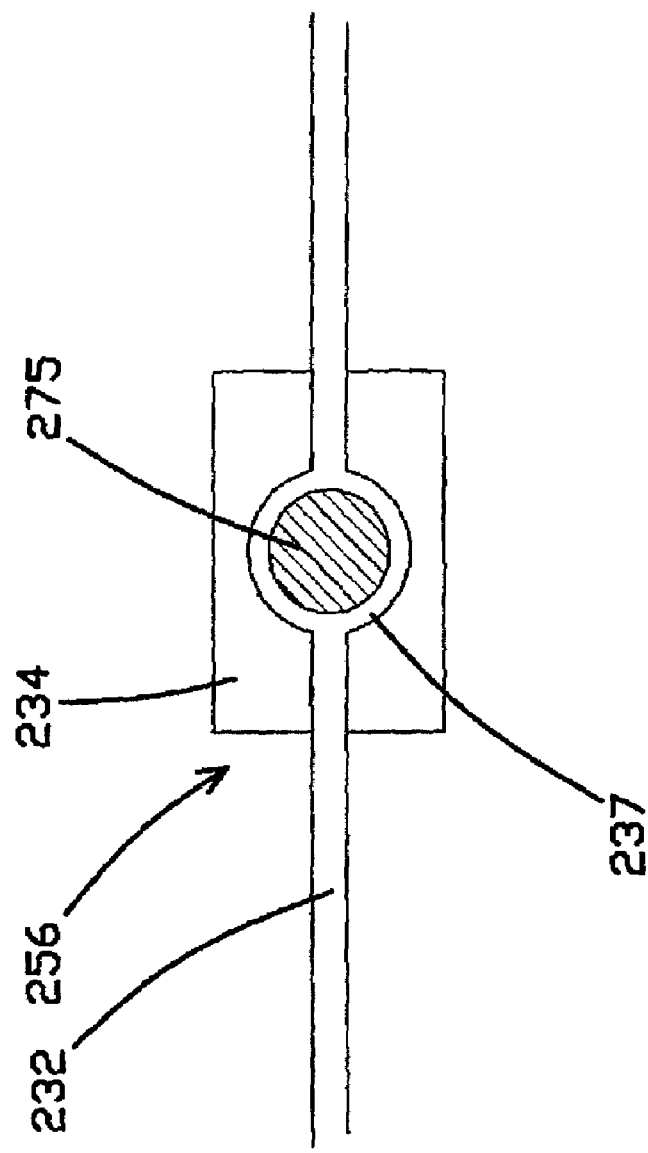
FIG. 10B is a top view of the embodiment of the invention shown in FIG. 10A with a solder joint adjoining the first and second conductors.

FIGS. 10A and 10B illustrate another embodiment of the invention. In this embodiment, terminal 256 includes a conductor 232 with a widened portion 238 and an aperture 250 formed through the widened portion on a main lead 248. Conductor 232 is positioned so that widened portion 238 is positioned above, and adjacent to, conductive surface 234. Widened portion 238 with aperture 250 functions similarly to the shoulder described in previous embodiments. Solder joint 275 engages a top surface 237 of the widened portion 238, partially or totally fills aperture 250, and engages conductive surface 234 to form an electrical and mechanical connection between conductor 232 and conductive surface 234. Widened portion 238 and aperture 250 are shown with generally circular shapes. It is to be understood, however, that the widened portion 238 and aperture 250 can be other shapes and configurations without departing from the scope of the invention. Although terminal 256 is shown located on the main lead 248, the terminal may be located anywhere on a disk drive head suspension assembly conducive to electrical interconnections, including on a circuit board, or a microactuator (as shown in FIG. 1).

Figure 10C:
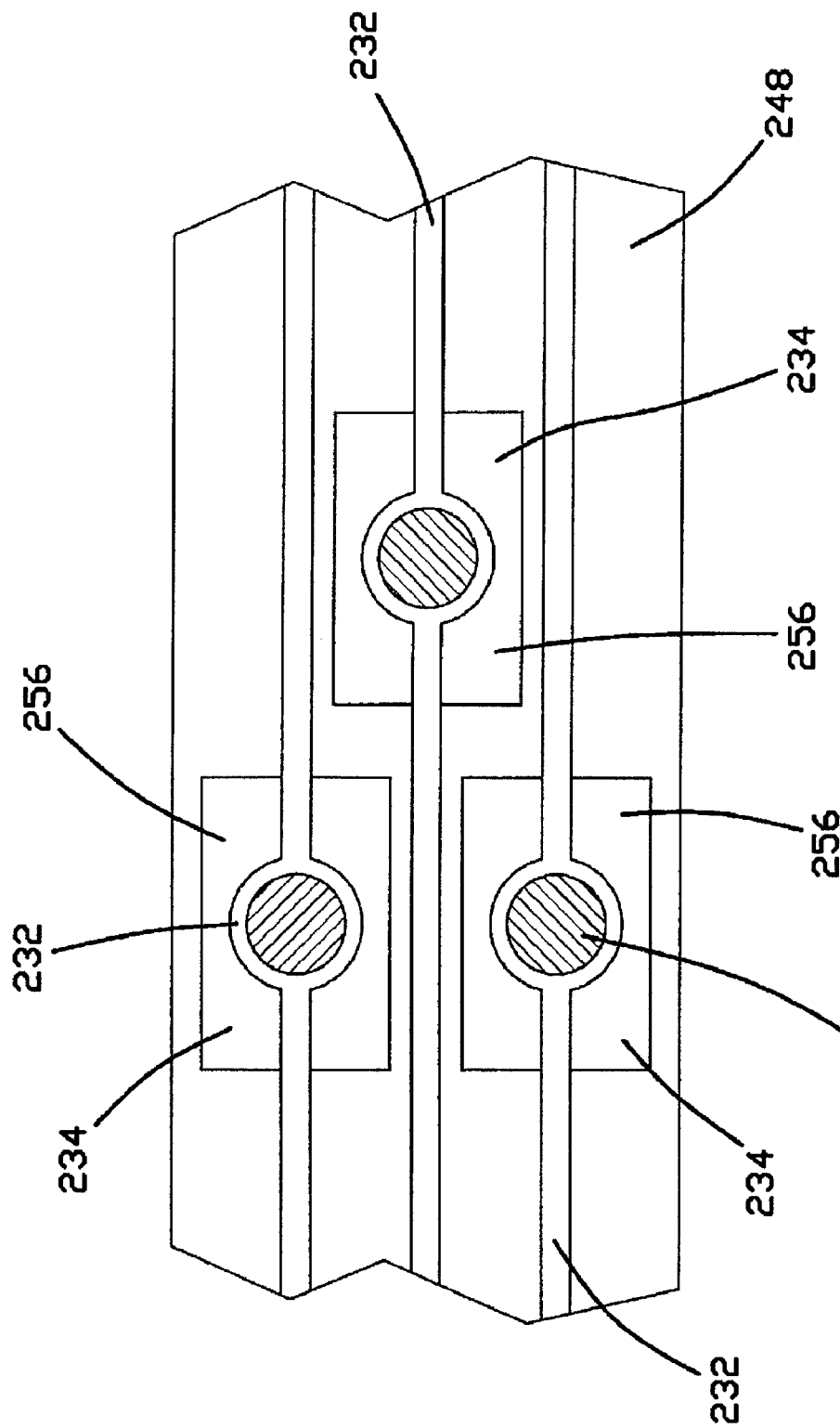
FIG. 10C is a top view of the embodiment of the invention shown in FIG. 10B showing a plurality of first and second conductors joined together and positioned adjacent each other.

FIG. 10C shows multiple conductors 232 aligned with each other on the main lead 248, with each of the conductors electrically and mechanically attached to the conductive surface 234 at the terminal 256 with a solder joint 275. The conductive surfaces 234 are offset with respect to each other to allow the conductors 232 to be placed more closely with respect to each other than if the conductive surfaces were positioned in a line.

Figure 11:
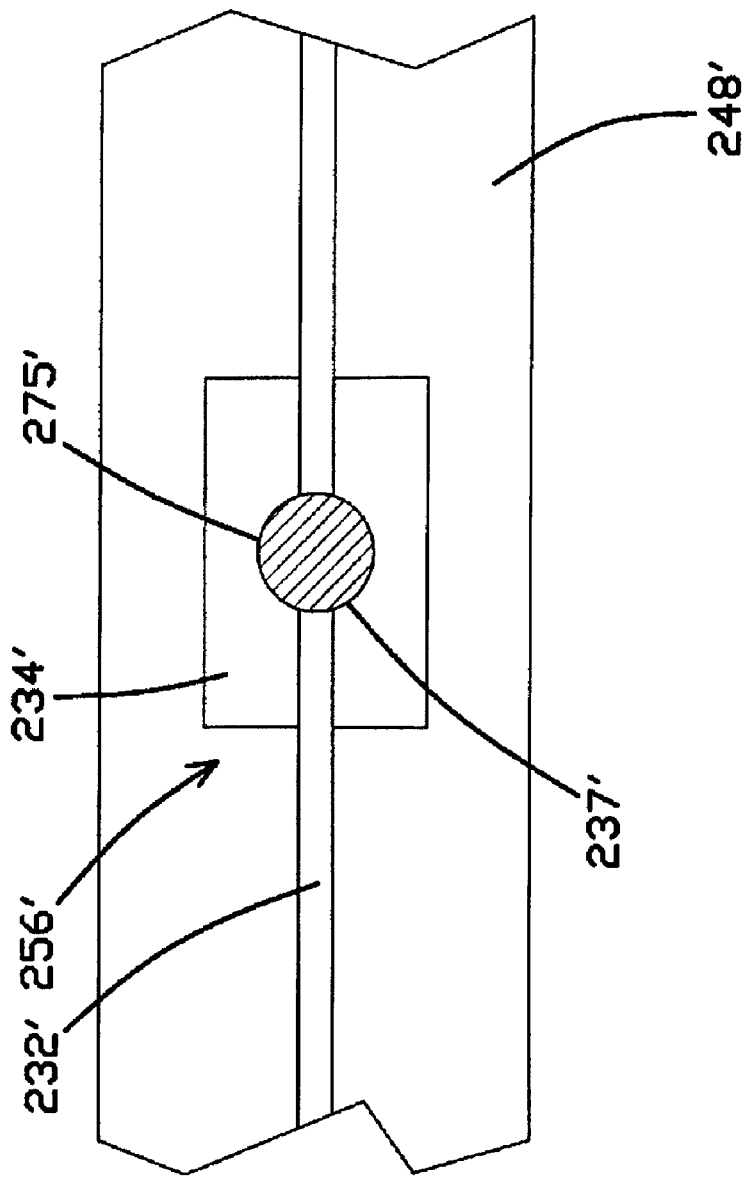
FIG. 11 is a top view of another embodiment of the invention showing a first conductor without a widened portion or an aperture adjacent a second conductor and joined together with a solder joint.

As illustrated in FIG. 11, in another embodiment, terminal 256', shown on a portion of main lead 248' can include a conductor 232' without a widened portion or an aperture. Rather, the conductor 232' can simply be positioned adjacent to and above conductive surface 234'. Solder joint 275' engages top surface 237' and spills over the edge of conductor 232' to engage conductive surface 234'. The solder joint then forms a mechanical and electrical connection between the two conductors.

Figure 12A:
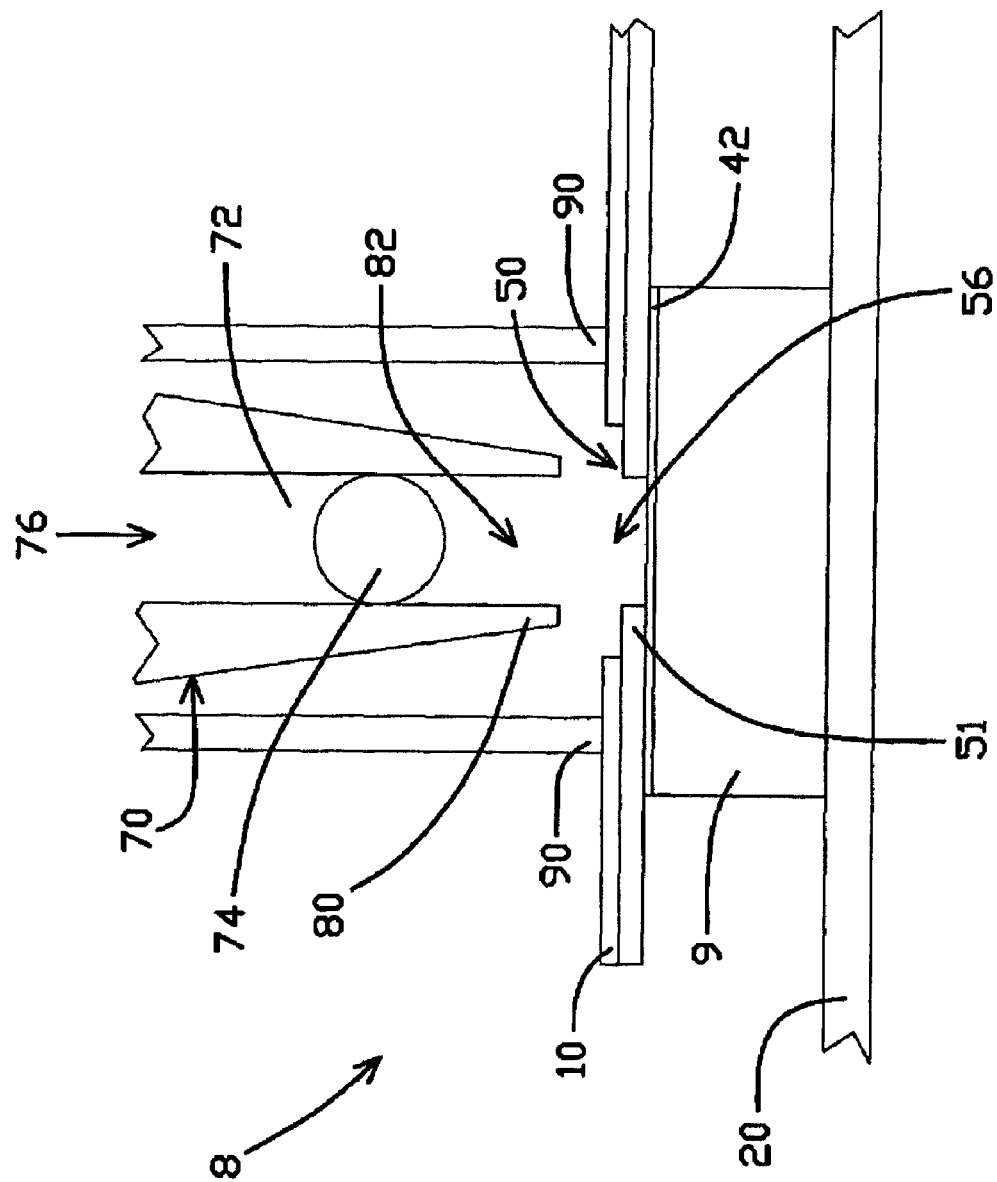
FIG. 12A is a cross-sectional side view of a head suspension manufacturing process in accordance with one method of manufacture illustrating a solder dispensing tool positioned above a portion of the head suspension.

The embodiments above describe leads that facilitate improved methods of making electrical and mechanical connections on a disk drive suspension assembly. FIG. 12A illustrates one embodiment of a method for manufacturing a suspension assembly 8 including attaching a connecting lead 10 to microactuator 9. Connecting lead 10 is positioned adjacent to microactuator 9 so that one terminal 56 formed into connecting lead 10 is aligned with a terminal 42 located on the microactuator. Once the connecting lead 10 is positioned over the terminal 42, a solder dispensing tool 70 is positioned over the terminal 56 as part of a solder dispensing process. The dispensing tool 70 includes a capillary tube 72 extending generally vertically toward a distal end 80 of the dispensing tool 70. The capillary tube 72 has an opening 82 at the distal end 80 of the dispensing tool 70. The tube 72 is sized to be slightly larger than the diameter of the solder ball 74. The solder dispensing tool 70 can include an engagement member 90 extending from or near the distal end 80 of the tool 70, to engage and ensure that the connecting lead 10 retains proper positioning with respect to the microactuator 9 while the connecting lead 10 and microactuator 9 are being attached to each other. Engagement member 90 may be integral to the dispensing tool 70, may be attached to the tool, may be attached to a device (not shown) near the dispensing tool, or, alternatively, the tool may not have an engagement member.

When the solder dispensing tool 70 is properly positioned over the terminal 56, the solder ball 74 is delivered into the capillary tube 72 and allowed to fall through the capillary tube and into the aperture 50. The dispensing tool 70 may provide pressure from a gas source (not shown) to urge the solder ball in the direction shown by arrow 76 through and out of the capillary tube 72 and into the aperture 50. In one embodiment, the gas provided by the gas source is nitrogen.

Figure 12B:
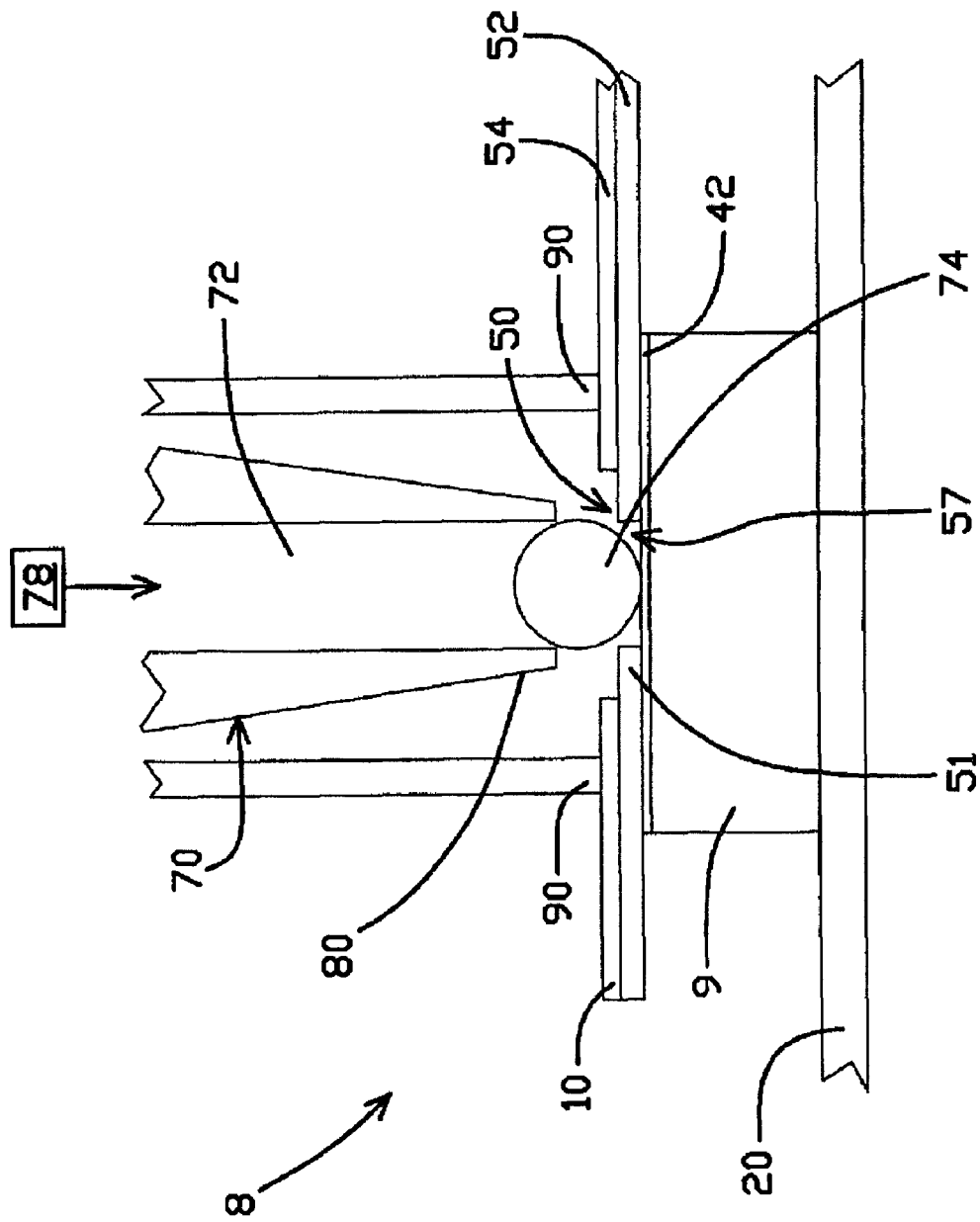
FIG. 12B is a cross-sectional side view of the head suspension manufacturing process shown in FIG. 12A illustrating a solder ball placed in an aperture on the head suspension.

Referring to FIG. 12B, the solder ball 74 can be sized smaller than reduced aperture portion 57 so that the solder ball is dispensed into the reduced aperture portion so as to rest on terminal 42. Further, the solder dispensing tool 70 may be positioned closely enough to the connecting lead 10 so that a portion of the solder ball 74 extends into the distal end 80 of the solder dispensing tool 70 while the solder ball is positioned within aperture 50. Thus, the solder dispensing tool 70 may aid in maintaining the position of the solder ball with respect to the aperture 50.

Once the solder ball 74 is positioned within the aperture 50, heat from a heat source 78 is introduced to heat the solder ball 74. Heat source 78 is positioned so that the heat source is not in contact with the connecting lead 10 or solder ball 74 when the heat is introduced to the solder ball. The heat source 78 provides sufficient heat to melt the solder ball 74, causing molten solder (not shown) to fall over an edge of the shoulder 51 and into the reduced portion 57 of the aperture 50. As the solder ball 74 is melted, the molten solder will engage the terminal 42 positioned adjacent the terminal 56, fill up or substantially fill up the reduced portion 57, and engage the top surface 58 of the shoulder 51 as is shown in FIG. 8.

The heat source 78 is preferably a laser beam that may be positioned to shine through the capillary tube 72 and onto the solder ball 74. Once the solder has been sufficiently heated to reach a molten state and flow into the aperture as described above, the heat source 78 can be removed to allow the solder to cool and solidify into a solder joint 75 (as shown in FIG. 8). It is to be understood that any suitable heat source or positioning of the heat source 78 in a location that is physically remote from the connecting lead 10 or solder ball 74 may be used, but the heat provided by the heat source is preferably concentrated on the solder ball 74 and optimized to minimize the amount of heat applied to the microactuator 9. It is to be further understood that although a single solder ball is shown as being dispensed into the aperture, two or more solder balls may likewise be dispensed without departing from the scope of the invention. In such a case, additional heat may be applied to reflow both the added balls and the original ball to create one solder mass. Furthermore, once the solder has cooled into a solder joint 75, the joint may optionally be trimmed by coining or striking off a portion of the joint (not shown).

The embodiment in FIGS. 12A and 12B shows a method of attaching the connecting lead 10 to the microactuator 9. The method disclosed, however, is not limited to attaching connecting lead 10 to microactuator 9. The method described in this and subsequent embodiments can be used to manufacture an assembly similar to or substantially the same as assembly 108' or terminal 256 or 256', as described above. For example, FIG. 9 shows an assembly 108' with connecting lead 110' attached to microactuator 109'. In this example, solder 175' has flowed into the portion of the aperture 150' formed into the cover layer 166' to engage the bottom surface 155' of the reduced portion 157' of the aperture during the manufacturing process (not shown). In addition, the disclosed methods can also be used to attach the connecting lead or other conductor to any desirable conductor, including to a trace on a main lead 48 (as shown in FIG. 1), to another connecting lead such as a flex circuit (not shown), or to a trace on a circuit board (not shown).

Figure 13A:
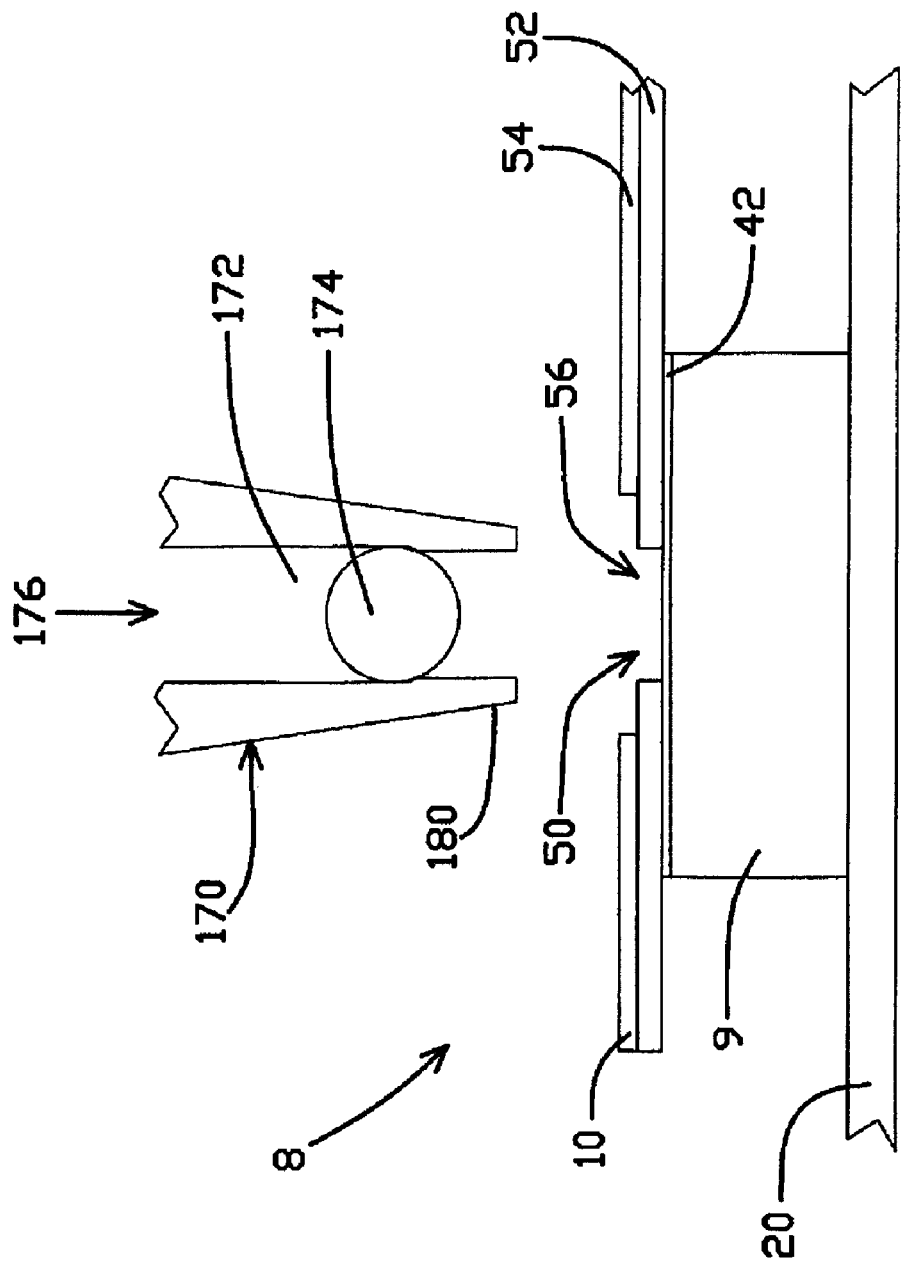
FIG. 13A is a cross-sectional side view of a head suspension manufacturing process in accordance with another embodiment of a method of manufacture showing a solder dispensing tool positioned above a portion of the head suspension.
Figure 13B:
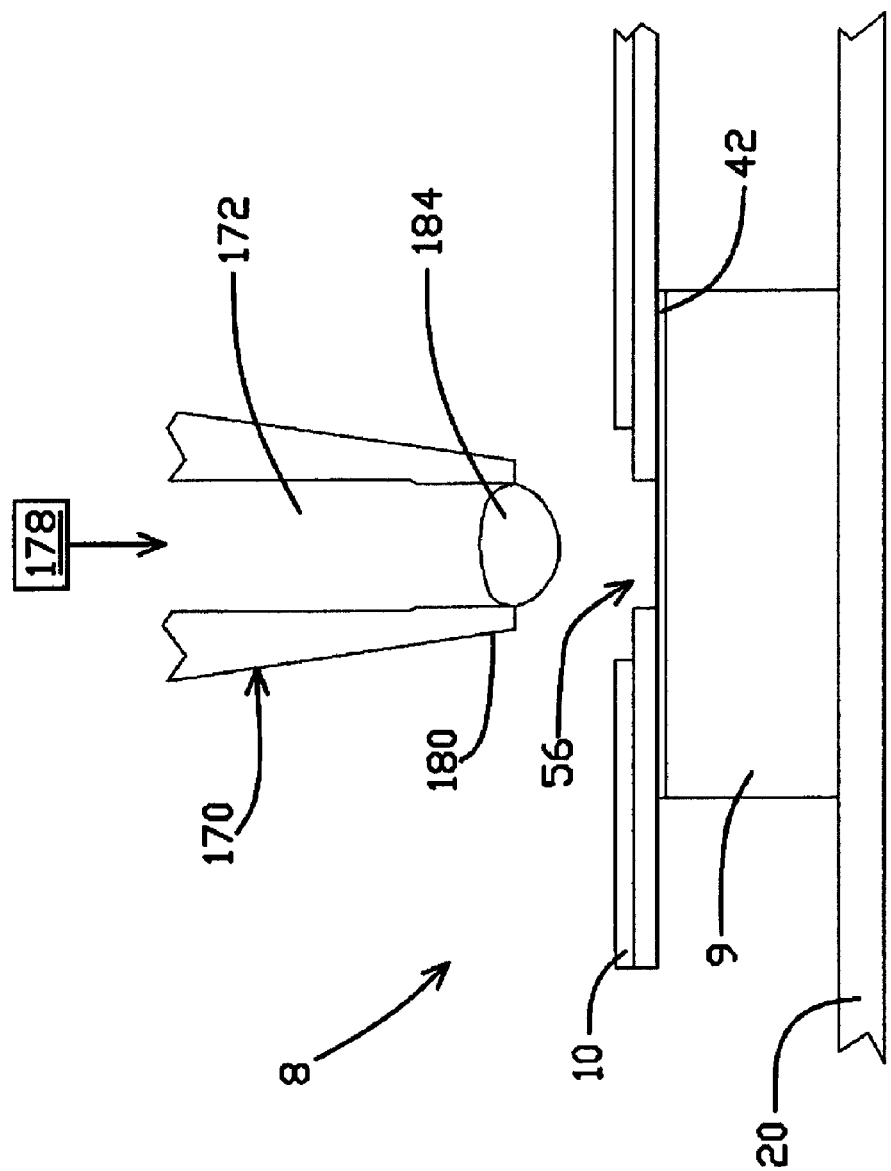
FIG. 13B is a side cross-sectional view of a head suspension manufacturing process shown in FIG. 13A illustrating a solder dispensing tool positioned above a portion of the head suspension and molten solder being dispensed into an aperture on the head suspension.

FIGS. 13A and 13B illustrate another embodiment of attaching connecting lead 10 to microactuator 9. Connecting lead 10 is positioned adjacent a microactuator 9 so that a terminal 56 is aligned with a terminal 42 located on the microactuator. Once the connecting lead 10 is positioned over the terminal 42, a solder dispensing tool 170 is positioned over the aperture 50. The solder dispensing tool 170 has a capillary 172 that is slightly smaller than a solder ball 174 that is intended to be dispensed into aperture 50. When the solder ball 174 is dispensed into the capillary tube 172, it is urged down the tube toward a distal end 180 of the solder dispensing tool 170. The solder ball 174 may be urged in a direction shown by arrow 176 by a pressure source (not shown). In one embodiment, the pressure source provides nitrogen gas to urge the solder ball 174 into the capillary tube 172. Instead of urging the solder ball 174 out of the capillary tube 172, the solder dispensing tool 170 holds the solder ball in the capillary tube. Then, heat is applied from a heat source 178 down the capillary tube 172 to the solder ball 174, causing the solder ball to change to a molten state while the ball is still within the capillary tube. Then, the molten solder 184 is urged out of the capillary tube 172 and into the aperture 50. The molten solder 184 spills over the top surface 58 of the shoulder 51 and into the reduced aperture 57, where it contacts the terminal 42 and the shoulder 51. As the molten solder 184 cools, a solder joint 75 (as shown in FIG. 8) is formed between the connecting lead 10 and the microactuator 9.

Because the dispensing tool 170 dispenses molten solder 184 into the aperture 50, the distal end 180 of the tool does not assist the positioning of the molten solder once it has been dispensed into the aperture 50. Thus, the distal end 180 may be positioned further away from the aperture 50 during the dispensing process. This allows the dispensing tool 170 to be moved from one aperture 50 in the connecting lead 10 to another aperture without adjusting the height of the dispensing tool with respect to the connecting lead. With the exception of the reduced diameter capillary tube 172, dispensing tool 170 can be substantially the same as dispensing tool 70 described above, and similar features are identified by similar reference numbers in the "1xx" series.

Figure 14:
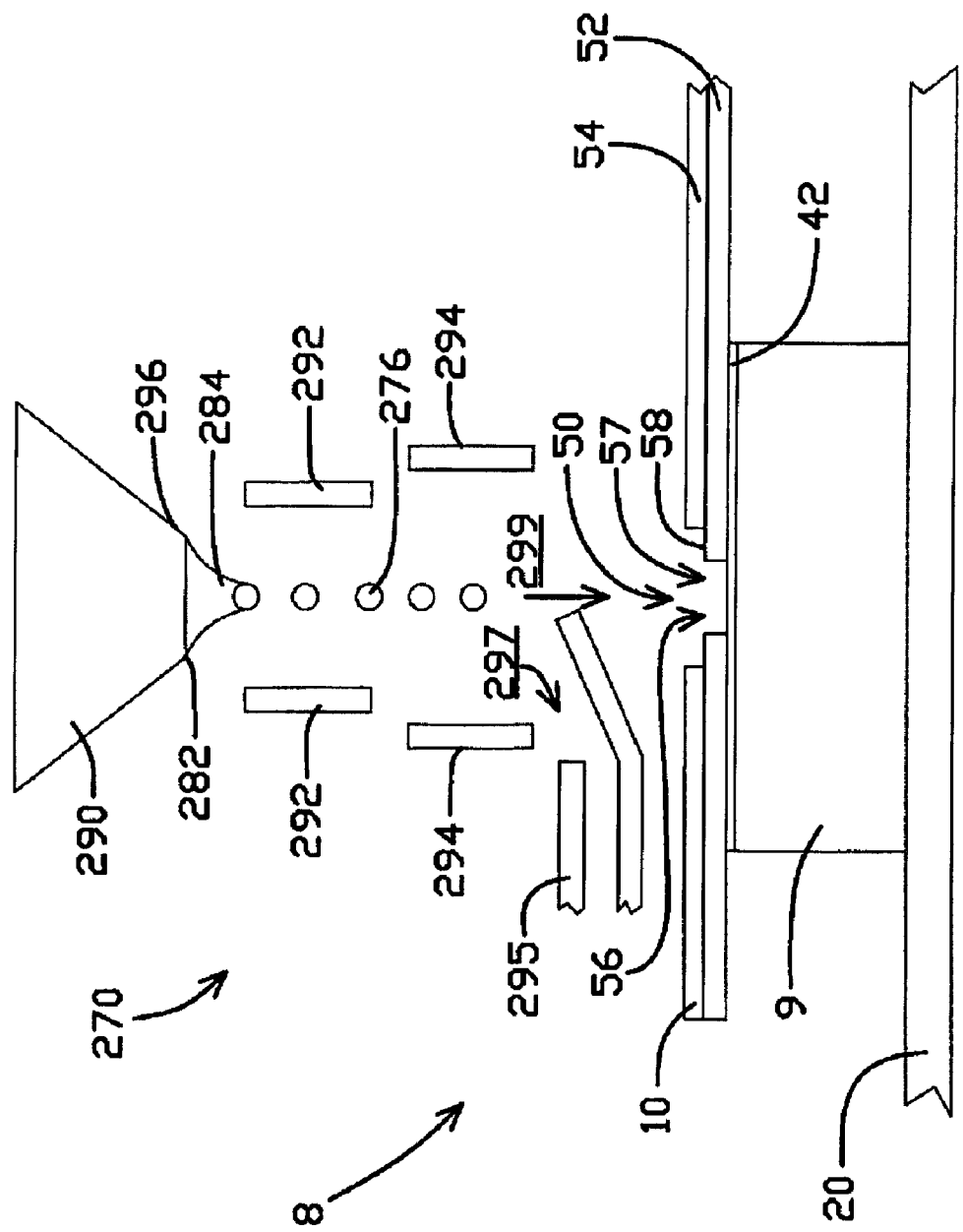
FIG. 14 is a side cross-sectional view of a head suspension manufacturing process in accordance with yet another method of manufacture showing a portion of a solder dispensing tool positioned above a portion of the head suspension and liquid solder being dispensed into an aperture on the head suspension.

FIG. 14 illustrates another embodiment of a method of manufacturing an assembly 8. Connecting lead 10 is shown positioned adjacent a microactuator 9 so that a terminal 56 is aligned with a terminal 42 located on the microactuator. In addition, connecting lead 10 is positioned under a solder dispensing tool 270 is positioned over the aperture 50. Solder dispensing tool 270 includes a transducer 290, which continuously expels liquid solder 284 out of an aperture 282 located at a distal end 296 of transducer 290. The liquid solder 284 then passes between charge plates 292, which introduce an electrostatic charge to the liquid solder, causing the solder to separate into solder balls 276. The solder balls 276 then fall between deflection plates 294 in the direction of arrow 299 and into the aperture 50. A sufficient number of solder balls 276 are introduced into the aperture to form a solder joint as described in previous embodiments. Because the transducer 290 is continuously expelling liquid solder 284, at times a connecting lead 10 may not be in position to accept solder balls 276. At that time, a voltage applied across the deflecting plates 294 redirects the solder balls 276 in the direction of arrow 297 into collector 295 for possible reuse. In this embodiment, heat is not required to reflow the solder. While the embodiment described in conjunction with FIG. 14 is directed towards a solder dispensing tool 270 that continuously expels solder out of transducer 290, it should be appreciated that alternative embodiments (not shown) can include a transducer that expels solder balls directly into an aperture on a connecting lead. These embodiments do not require that the solder be exposed to an electrostatic charge and do not require deflecting plates 294.

It is to be understood that other methods of applying solder into the aperture may be used in accordance with this invention. For example, once a connecting lead is positioned properly with respect to a terminal, solder may be applied in a paste form (not shown) or introduced in a wire form (not shown). Subsequently, heat from a remote heat source such as the ones described in previous embodiments can heat the solder and cause it to reflow and create a solder joint.

The invention described above offers several advantages. The current invention facilitates the creation of solder joints on disk drive suspension assemblies that minimize the heat applied to sensitive components such as microactuators. In addition, the force applied to suspension components during the attachment process is reduced, also leading to reduced damage to or distortion of components such as the microactuators and connecting leads. Further, the processes described are not limited to situations where the terminals are aligned either horizontally or vertically with respect to each other. Further still, the application of solder and heating the solder to form the solder joint in a single process results in faster, more efficient assembly processes.

Although the present invention has been described with reference to preferred embodiments, those skilled in the art will recognize that changes can be made in form and detail without departing from the spirit and scope of the invention. For example, the structures and methods described can be applied to a number of different applications within disk drive head suspension assemblies and other related technologies.

What is claimed is:

1. A method for electrically connecting a lead to a piezoelectric motor on a disk drive suspension, comprising:
    positioning a lead having a terminal with a major surface and an edge adjacent to a piezoelectric motor having a terminal with a major surface with the major surface of the lead terminal facing the major surface of the motor terminal;
    dispensing one or more solder balls to the positioned lead and motor terminals through a tube with the tube free from contact with the lead and motor terminals;
    providing heat from a source that is physically remote from the lead and motor terminals to melt the solder balls while the solder balls are within the tube;
    causing the melted solder balls to flow out of the tube and over the major surface and edge of the lead terminal and onto the major surface of the motor terminal; and
    removing the heat to allow the solder to resolidify and form an electrical and mechanical interconnection between the lead and motor terminals.

2. The method of claim 1, wherein the step of providing heat includes applying a laser beam to melt the solder balls.

3. The method of claim 1, wherein the step of dispensing the solder balls includes providing a pressurized gas to force the melted solder balls out of the tube and onto the first and second terminals.

4. The method of claim 1 wherein the step of positioning the lead further comprises positioning the lead so that an aperture formed through the lead terminal is adjacent the piezoelectric motor terminal.

5. The method of claim 4, wherein the step of causing the solder balls to flow out of the tube includes causing the melted solder balls to flow into the aperture so that the solder contacts a portion of the lead terminal adjacent the aperture.

6. The method of claim 1, wherein the first component lead comprises a flexible circuit.

7. The method of claim 1, wherein the step of dispensing solder balls comprises jetting solder droplets.

8. The method of claim 1 for sequentially forming electrical and mechanical interconnections between terminals of a plurality of leads and piezoelectric motors, including:
    moving the tube with respect to the plurality of leads and motors after forming the interconnections on the leads and motors; and
    not adjusting the height of the tube with respect to the terminals of the leads and motors between the formation of the interconnections on the plurality of leads and motors.

* * * * *

UNITED STATES PATENT AND TRADEMARK OFFICE
CERTIFICATE OF CORRECTION

| | | |
|---|---|---|
| PATENT NO. | : 7,658,001 B1 | Page 1 of 1 |
| APPLICATION NO. | : 11/935768 | |
| DATED | : February 9, 2010 | |
| INVENTOR(S) | : Galen D. Houk | |

It is certified that error appears in the above-identified patent and that said Letters Patent is hereby corrected as shown below:

Column 10, line 48, delete "first component"

Signed and Sealed this

Fourth Day of May, 2010

David J. Kappos
*Director of the United States Patent and Trademark Office*